United States Patent
Foo et al.

(10) Patent No.: US 6,208,139 B1
(45) Date of Patent: *Mar. 27, 2001

(54) SYSTEM AND METHOD OF PHASE SENSITIVE MRI RECONSTRUCTION USING PARTIAL K-SPACE DATA

(75) Inventors: Thomas K. F. Foo, Rockville, MD (US); Jason A. Polzin, Lake Mills, WI (US)

(73) Assignee: General Electric Company, Milwaukee, WI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/154,673

(22) Filed: Sep. 18, 1998

(51) Int. Cl.[7] .................................................. G01R 33/20
(52) U.S. Cl. ............................................ 324/309; 324/307
(58) Field of Search .................................. 324/300–322

(56) References Cited

U.S. PATENT DOCUMENTS

| | | | |
|---|---|---|---|
| 5,243,284 | * 9/1993 | Noll ......................................... | 324/309 |
| 5,602,934 | * 2/1997 | Li et al. ................................... | 382/128 |
| 5,729,140 | * 3/1998 | Kruger et al. ........................... | 324/309 |

OTHER PUBLICATIONS

Douglas C. Noll, Dwight G. Nishimura, and Macovski A. Homodyne Detection in Magnetic Resonance Imaging, *IEEE Trans. Med. Imaging* 1991; 10: 154–163.

* cited by examiner

Primary Examiner—Christine K. Oda
Assistant Examiner—Tiffany A. Fetzner
(74) Attorney, Agent, or Firm—Boyle Fredrickson; Christian G. Cabou; Phyllis Y. Price

(57) ABSTRACT

A system and method for phase sensitive MRI reconstruction using partial k-space data to reduce either scan time or echo time, depending on whether partial echo or partial NEX MR data is acquired, that retains phase information and reduces edge blurring in a magnetic resonance image. Phase sensitive partial k-space data reconstruction improves upon the homodyne reconstruction process to estimate and correct for an edge blurring convolution error term in a partial echo or partial NEX data while preserving phase information. The phase sensitive partial k-space reconstruction includes Fourier transforming and filtering the partial k-space data through high and low-pass filters, and a linear combination of both, and estimating a blurring correction term, representative of a convolution error factor, from a portion of the filtered data set. Once the blurring correction factor is determined, it is applied to remove the convolution error term from the filter data set in order to reconstruct an MRI having, both magnitude and phase information while minimizing edge blurring that normally results from partial k-space data acquisition.

23 Claims, 3 Drawing Sheets

SYSTEM AND METHOD OF PHASE SENSITIVE MRI RECONSTRUCTION USING PARTIAL K-SPACE DATA

BACKGROUND OF THE INVENTION

The present invention relates generally to magnetic resonance imaging (MRI), and more particularly to system and method of phase sensitive MRI reconstruction using partial k-space data to minimize data acquisition time (TE) while preserving phase information and reducing edge blurring in the reconstructed image.

In MR imaging, the scan time can be reduced by using a partial NEX, or alternatively, the echo time can be reduced by using a fractional echo. This moves the time to the echo peak closer to the start of the read-out gradient waveform than in a full echo. However, in all partial echo or half-Fourier reconstruction strategies, all phase information is lost. The present invention is a method and system for using the homodyne reconstruction algorithm to generate a complex-valued image from which phase information can be extracted.

In general, the synthesis of the missing k-space data assumes that the MR data is Hermitian for a real-valued image. That is:

$$F(-k_x)=*(k_x) \qquad [1]$$

where the * denotes a complex conjugate. If the k-space is divided into 4 quadrants, the data for at least two of the four quadrants is needed in order to generate an image. Therefore, either a partial echo (partially filled $k_x$) or partial NEX (partially filled $k_y$) can be used, but not both.

The following background is a review of the prior art homodyne method. If $f(x)$ is the real-valued image and $\phi(r)$ is the spatially varying phase in the image, the expression for the complex valued image can be written as:

$$I(x)=f(x)\exp(j\phi(x))=f_L(x)\exp(j\phi_L(x))+f_H(x)\exp(j\phi_H(x)). \qquad [2]$$

This expression is a linear combination of the Fourier transforms of the low-pass and high-pass filtered k-space data, respectively. In homodyne reconstruction, the phase is assumed to be slowly varying and that $\phi_L(x) \approx \phi_H(x)$. Therefore, if only one-half of the high-pass filtered data is available, this is equivalent to multiplying the high-pass filtered data by a Heaviside function such that the resulting image is given by:

$$I_H(x) = f_L(x)\exp(j\phi_L(x)) + f_H(x)\exp(j\phi_L(x)) \otimes \frac{1}{2}\left(\delta(x) + \frac{1}{j\pi x}\right), \qquad [3]$$

where $\otimes$ denotes a convolution. Since the convolution term decays with $1/x$ and that the phase is slowly varying, Eqn. [3] can be rewritten as:

$$I_H(x) \approx \left(f_L(x) + \frac{1}{2}f_H(x) - \frac{j}{2}f_H(x) \otimes \frac{1}{\pi x}\right)\exp(j\phi_L(x)). \qquad [4]$$

If the available high frequency data is weighted by 2, Eqn. [4] can be written as:

$$I_H(x) = \left(f_L(x) + f_H(x) - jf_H(x) \otimes \frac{1}{\pi x}\right)\exp(j\phi_L(x)). \qquad [5]$$

If the spatially varying phase term is divided out, the image is then the real-valued part of $I_H(x)\exp(-j\phi_L(x))$, i.e.:

$$f_L(x)+f_H(x)=f(x)=Re(I_H(x)\exp(-j\phi_L(x))), \qquad [6]$$

where the spatially varying phase is estimated from the phase of the Fourier transform of the low-pass filtered data. It is noted that in Eqn. [6], all phase information has now been lost. Note that Eqn. [6] could easily be written as $f(x)=Re(I_H(x))e^{-j\phi_L(x)}$ where the phase in the image is the low spatial frequency phase. However, this phase is only an estimate and is of little use. Hence, this technique is not suitable for phase contrast reconstruction. Furthermore, the loss of phase information requires that the Fourier transform in the y direction be performed first, before the homodyne reconstruction is applied to the data in the x direction.

It would therefore be desirable to have a system and method capable of preserving magnitude and phase information in a partially acquired k-space data set that allows reduced data acquisition times and significantly improves edge blurring in the reconstructed MR image.

SUMMARY OF THE INVENTION

The present invention provides a system and method of phase sensitive FIRS reconstruction using partial k-space data that overcomes the aforementioned problems.

The present invention describes a technique by which a phase sensitive reconstruction can be performed on either half-echo or half-NEX MR data. This allows an image with higher spatial resolution (reduced edge blurring) to be acquired in a much shorter period of time and yet preserve the image phase information. This method builds on the prior art homodyne reconstruction process to estimate and correct for the edge blurring in partial echo or partial NEX data that is usually reconstructed using zero-filling to preserve phase information. Zero-filling alone results in some image degradation as the asymmetrical echo data is not corrected prior to image reconstruction, forcing a much higher partial echo or partial NEX fraction to be used in order to restore the loss in image fidelity.

In accordance with one aspect of the invention, a method of phase sensitive magnetic resonance image (MRI) reconstruction using partial k-space data is disclosed having the steps of acquiring a partial k-space data set having both imaginary and real components representative of both magnitude and phase information, filtering the partial k-space data set through high and low-pass filters, and Fourier transforming the filtered data set. The method next includes the step of estimating a blurring correction term representative of a convolution error factor from a portion of the filtered data set and applying the blurring correction factor to the filtered data set to remove the convolution term and reconstruct an MIR having both magnitude and phase information while minimizing edge blurring in the reconstructed MRI.

In accordance with another aspect of the invention, the above described steps are accomplished in a system to correct edge blurring in an image reconstructed with partial k-space data. The system includes a magnetic resonance imaging system having a number of gradient coils positioned about a bore of a magnet to impress a polarizing magnetic field and an RF receiver system and an RF modulator controlled by a pulse control module to transmit RF signals to an RF coil assembly to acquire MR images. The system includes a computer programmed to acquire only a partial k-space data set having both magnitude and phase information. The program also filters the partial k-space data set through high and low-pass filters and Fourier transforms the filtered data set. Next, a blurring correction factor is estimated from a portion of the filtered data set and applied to the filtered data set to remove a convolution error term and reconstruct an MRI having both magnitude and phase information thereby minimizing data acquisition time and edge blurring in the reconstructed MRI.

In accordance with another aspect of the invention, a system for minimizing edge blurring in a reconstructed MRI using partial k-space data is comprised of a means for acquiring partial k-space data containing both magnitude and phase components, a means for partially calculating a homodyne reconstructed MRI, and a means for retaining the phase components in the partially calculated homodyne reconstructed MRI. The system further includes a means for removing a blurring error term from the partially calculated homodyne reconstructed MRI having both the phase component and a magnitude component therein with reduced MRI edge blurring.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
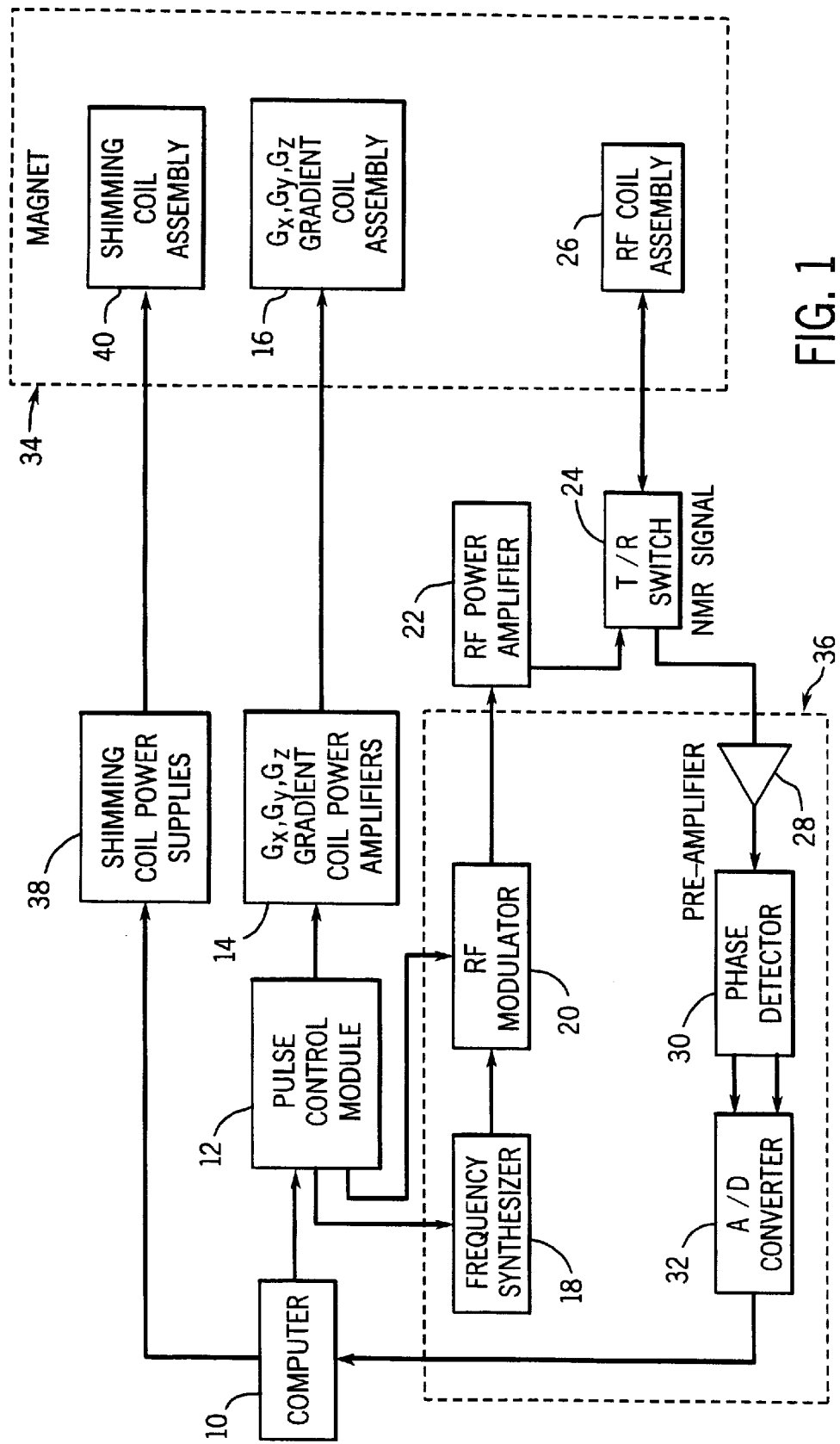
FIG. 1 is a schematic block diagram of an MIR imaging system for use with the present invention.

Referring to FIG. 1, a nuclear magnetic resonance (NMR) imaging system of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to $G_x$, $G_y$, $G_z$ gradient coil assembly 16 which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by RF power amplifier 22 and applied to RF coil 26 through transmit/receive switch 24, are used to excite the nuclear spins of the imaged object (not shown).

The NMR signals from the excited nuclei of the imaged object are picked up by the RF coil assembly 26 and presented to preamplifier 28 through transmit/receive switch 24, to be amplified and then processed by a quadrature phase detector 30. The detected signals are digitized by a high speed A/D converter 32 and applied to computer 10 for processing to produce NR images of the object. Computer 10 also controls shimming coil power supplies 38 to power shimming coil assembly 40.

Figure 2:
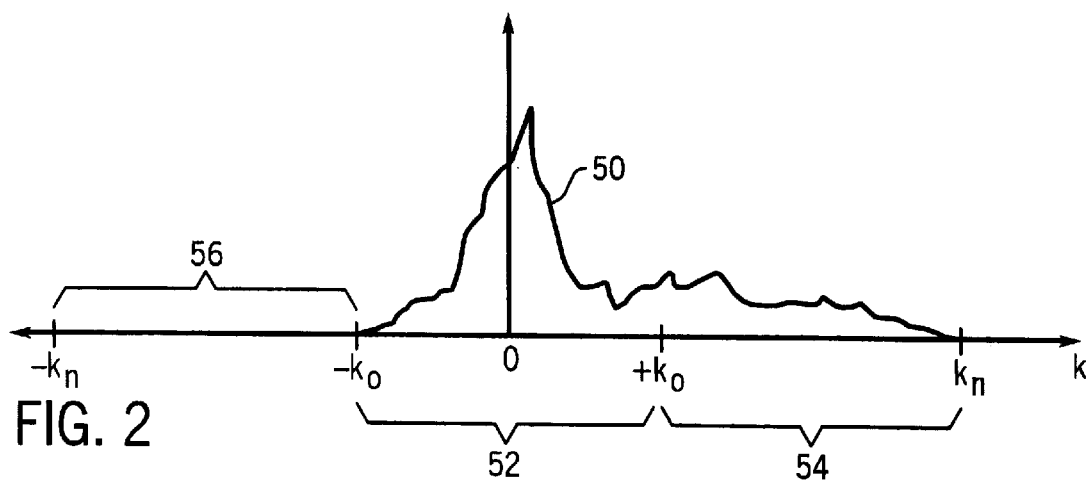
FIG. 2 is a graphical representation of a partial k-space data acquisition.

The present invention includes a method and system suitable for use with the above-referenced NMR system, or any similar or equivalent system for obtaining MR k-space data for use in reconstructing MR images. The present invention includes acquiring partial k-space data having both imaginary and real components containing representations of both the magnitude and phase of the partial k-space data. FIG. 2 shows a graph of an exemplary partial k-space data set 50 in which data is present from $-k_0$ through $+k_0$ in the low frequency domain 52, and from $+k_0$ through $k_n$ in the high frequency 54 domain. This exemplary data set was acquired through either a partial echo or a partial NEX to allow for reduced echo time (TE) or scan time. As a result, high frequency data is absent for half of the k-space high frequency domain 56 from $-k_0$ through $-k_n$.

To more accurately represent the MR image, it is desirable to fill in the missing data points between $-k_0$ through $-k_n$. In typical phase contrast acquisitions, a partial echo is commonly used to minimize the sequence TE time and improve the S/N of the vascular signal. However, to avoid image blurring, it is desirable to use a high fractional echo typically of the order of 75% to 80% of a full echo. In order to retain phase information, image reconstruction is a zero-filled Fourier transform of the frequency-encoded data.

The image of the zero-filled data can be written as $$I_z(x) = \qquad [7]$$
$$f_L(x)\exp(j\phi_L(x)) + \frac{1}{2}f_H(x)\exp(j\phi_L(x)) - \frac{j}{2}f_H(x)\exp(j\phi_L(x)) \otimes \frac{1}{\pi x}.$$

Even if a sufficiently high echo fraction is used, the image will suffer from blurring as the result of inadequately weighted high spatial frequency information and from the convoluting function.

The problem with this approach is it cannot minimize the TE and preserve the phase information without incurring penalties to image quality. If a high partial echo fraction is acquired, as used with the previously described zero-filled data, and that the phase is assumed to be slowly varying, the phase term can be pulled out and the result is given by:

$$I_z(x) \approx \left( f_L(x) + \frac{1}{2}f_H(x) - \frac{j}{2}f_H(x) \otimes \frac{1}{\pi x} \right)\exp(j\phi_L(x)). \qquad [8]$$

Next, the same weighting factors are applied as in the homodyne reconstruction algorithm, that are given by:

$$W_H(k) = \begin{cases} 0, & k < -k_0 \\ 1, & -k_0 \leq K \leq k_0 \\ 2, & k > +k_0 \end{cases} \qquad [9a]$$

$$W_L(k) = \begin{cases} 1, & -k_0 \leq k \leq k_0 \\ 0, & \text{otherwise} \end{cases} \qquad [9b]$$

Figure 3:
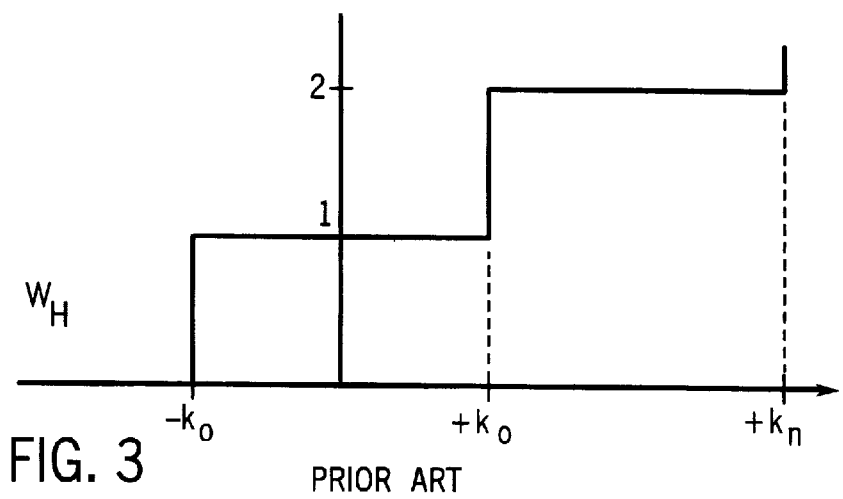
FIG. 3 is a graphical representation of a step filter for use with the partial k-space data of FIG. 2.

Referring to FIG. 3, a step filter $W_H$, is applied to the data of FIG. 2. That is, for k-space data between $-k_0$ and $+k_0$, the low-pass filter adjusts the data to a value of 1, and for the k-space outside of the low frequency domain 52 it sets the data value to zero, except for the region +$k_0$ to +$k_n$ where the weight is set to a value of 2.

If this filter is applied to the acquired k-space data, Eqn. [8] can be written as:

$$I_c(x) \approx \left(f_L(x) + f_H(x) - jf_H(i) \otimes \frac{1}{\pi x}\right) \exp(j\phi_L(x)). \quad [10]$$

Although Eqn. [10] is a better approximation than Eqn. [8], in order to remove the phase variation caused by the convolution term, $$jf_H(i) \otimes \frac{1}{\pi x},$$

additional steps are required.

Figure 6:
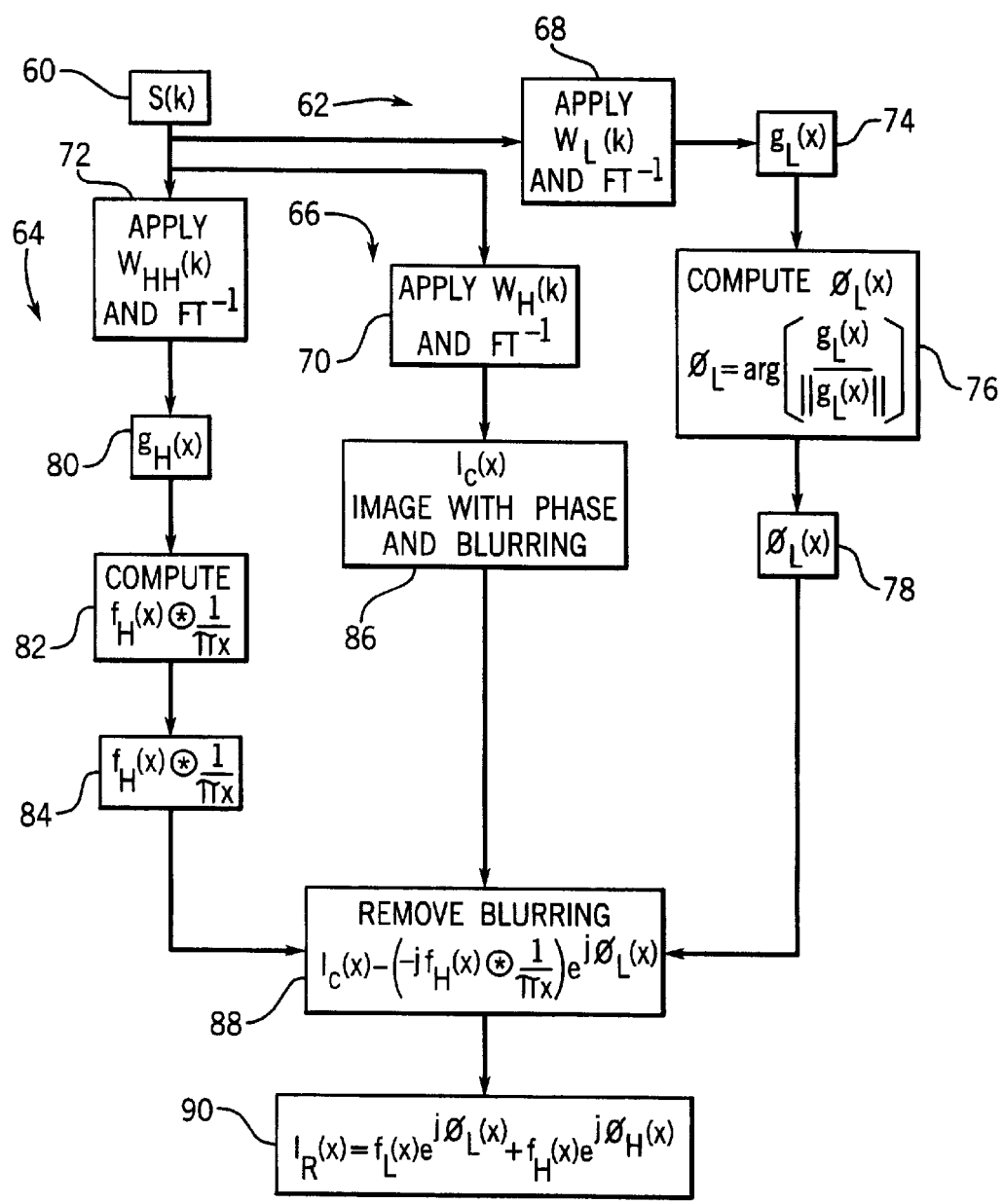
FIG. 6 is a flow chart of a portion of the system and method of the present invention.

In a preferred embodiment, the following described algorithm is performed in parallel as shown in, and referenced to, FIG. 6. After acquiring a partial k-space data set 60, the system is programmed to parallel process the following algorithm along at least three predefined subroutines 62, 64, and 66. Each of the subroutines include an initial filtering and Fourier transforming step 68, 70 and 72.

Figure 4:
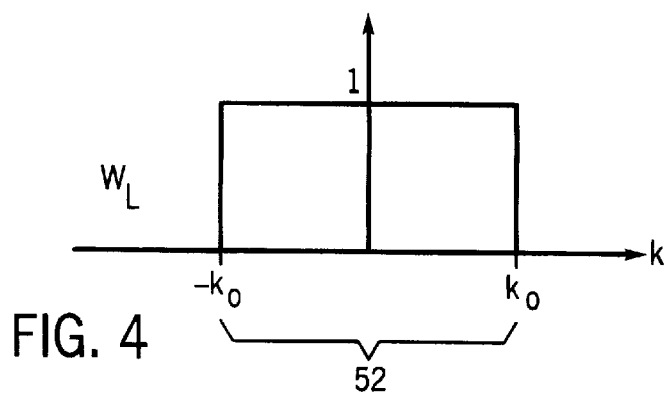
FIG. 4 is a graphical representation of the partial k-space data of FIG. 2 after filtered through a low-pass filter in accordance with one aspect of the invention.

The first subroutine 62 next involves estimating the low-passed filtered spatially-varying phase as:

$$\exp(j\phi_L(x)) = \frac{g_L(x)}{\|g_L(x)\|}, \quad [11]$$

where $g_L(x)$ 74 is the complex-valued Fourier transform of the low-pass filtered k-space data from $[-k_0 \ldots +k0]$, using the weighting function of FIG. 4. The computation 76 results in an estimation of the phase $\phi$ at 78.

Figure 5:
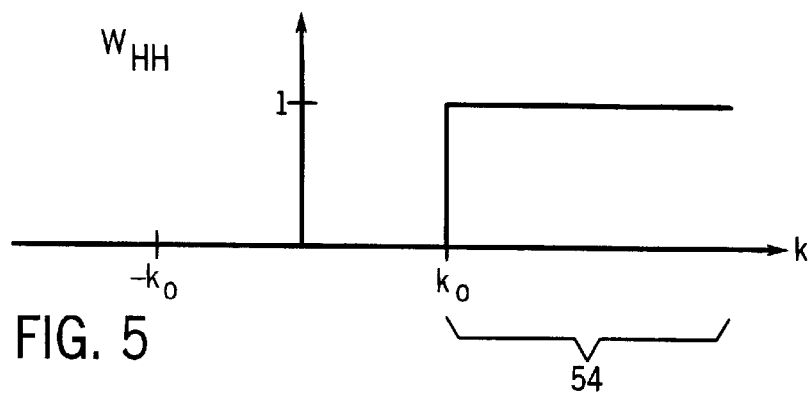
FIG. 5 is a graphical representation of the partial k-space data of FIG. 2 after filtered through a high-pass filter in accordance with one aspect of the invention.

The next subroutine 64, after filtering and transforming 72, includes estimating the blurring correction factor at 82 from the convolution term. If $g_H(x)$ 80 is the complex-valued Fourier transform of the filtered k-space data, $f(k) \cdot W_{HH}(k)$ of FIG. 5, where $$W_{HH}(k) = \begin{cases} 0, & k < +k_0 \\ 1, & \text{otherwise} \end{cases} \quad [12]$$

$g_H(x)$ can them be written as:

$$g_H(x) = \frac{1}{2}\left(f_H(x) - jf_H(x) \otimes \frac{1}{\pi x}\right) \exp(j\phi_L(x)), \quad [13]$$

assuming that the phase, in the image is slowly varying. Hence the blurring from the convolution term 84 in Eqn. [8] is then twice the imaginary component of $g_H(x)$ after dividing out the phase term, $\phi_L(x)$, i.e.:

$$f_H(x) \otimes \frac{1}{\pi x} = -2 \cdot Imag\left(g_H(x)\frac{\|g_L(x)\|}{g_L(x)}\right). \quad [14]$$

After applying a weighting function, as in Eqn. [9], to the partial echo k-space data and obtain its Fourier transform 70, of the next subroutine 66, an image having phase and a blurring error 86 is generated as $I_c(x)$.

To then remove the blurring error 84, Eqn. [14] is multiplied by the low frequency phase estimate 78 and subtracted from $I_c(x)$ 86 at step 88. The result is an improved approximation of the image:

$$I_R(x) = I_C(x) + 2j \cdot \frac{g_L(x)}{\|g_L(x)\|} \cdot Imag\left(g_H(x)\frac{\|g_L(x)\|}{g_L(x)}\right). \quad [15]$$

$$= f_L(x)e^{j\phi_L(x)} + f_H(x)e^{j\phi_H(x)} \quad [15a]$$

This resultant image $I_R(X)$ 90 is a complex-valued image that retains the phase information and reduces blurring and data acquisition times.

In practice, it is desirable to have the k-space filters described in Eqns. [9] and [12] to have a much smoother transition in order to minimize the rapid changes in k-space weighting that cause edge ringing artifacts in the image. The abrupt step functions are preferably substituted with a smoothly varying fermi filter, such that Eqn. [9] is replaced with:

$$W_H(k) = 2 - \frac{1}{1 + \exp((k - k_0)/ntrans)} - \frac{1}{1 + \exp((k + k_0)/ntrans)}, \quad [16]$$

and, similarly, Eqn. [12] can be replaced with:

$$W_{HH}(k) = 1 - \frac{1}{1 + \exp((k - k_0)/ntrans)}, \quad [17]$$

where ntrans is the transition width of the fermi distribution function. This implies that the smoothed filter will have a convolution term that falls off faster than the 1/x term of Eqn. [8], for example. This will improve the conditions under which the assumption that $\phi_L(x)$ does not change substantially where the signal power for the 1/x convolution term is significant.

Accordingly, the present invention includes a method of phase sensitive MRI reconstruction using partial k-space data including the steps of acquiring a partial k-space data set having both imaginary and real components containing both magnitude and phase information and filtering the partial k-space data set through high and low-pass filters, and Fourier transforming the filtered data set. The method next includes estimating a blurring correction factor representative of a convolution error term from a portion of the filtered data set and applying the blurring correction factor to the filtered data set to remove the convolution error term and reconstruct an MRI having both magnitude and phase set information thereby minimizing edge blurring in the reconstructed MRI. Preferably, the partial k-space data set is acquired in the range of approximately 75% to 80% of a full MRI. The method is further defined as calculating a low frequency spatial phase and applying the blurring correction factor to the filtered data set to remove the convolution error term.

The system of the present invention is designed to correct edge blurring in an image reconstructed with partial k-space data obtained from a magnetic resonance imaging system such as that shown in FIG. 1. The system includes a computer programmed to accomplish the foregoing steps.

A system is shown to correct edge blurring in an image reconstructed with partial k-space data. The system includes a magnetic resonance imaging system having a number of gradient coils positioned about a bore of a magnet to impress a polarizing magnetic field and an RF receiver system and an RF modulator controlled by a pulse control module to transmit RF signals to an RF coil assembly to acquire MR images. The system includes a computer programmed to acquire only a partial k-space data set having both magnitude and phase information. The program also filters the partial k-space data set through high and low-pass filters and Fourier transforms the filtered data set. Next, a blurring correction factor is estimated from a portion of the filtered data set and applied to the filtered data set to remove a convolution error term and reconstruct an MRI having both magnitude and phase information thereby minimizing data acquisition time and edge blurring in the reconstructed MRI.

The invention includes a system for minimizing edge blurring in a reconstructed MRI using partial k-space data having a means for acquiring partial k-space data containing both magnitude and phase components, a means for partially calculating a homodyne reconstructed MRI, and a means for retaining the phase components in the partially calculated homodyne reconstructed MRI. The system further includes a means for removing a blurring error term from the partially calculated homodyne reconstructed MRI having both the phase component and a magnitude component therein with reduced MRI edge blurring.

The present invention was tested using a full echo data set as the reference data, and reconstructing an image using only 60% of the echo. With conventional homodyne reconstruction, only a magnitude image could be obtained. However, the full echo phase image was compared to the phase reconstruction of the partial echo data, and without the use of the fermi filters of Eqns. [16]–[17], the results showed reduced blurring but with some ringing off the edges in the test image. The data reconstructed without the use of the filters of Eqns. [16]–[17], is essential data reconstructed using zero-filling.

The phase image reconstructed from a full echo data set displayed normal phase variation across the image resulting from Bo inhomogeneity, as exaggerated by mis-setting the shims. The phase image using 60% of the echo of the same data set and the proposed reconstruction algorithm generated an equivalent phase image while maintaining good edge definition. When compared to a zero-filled reconstructions, the same phase information is retained together with a reduction in the ringing off the edges.

The present invention has been described in terms of the preferred embodiment, and it is recognized that equivalents, alternatives, and modifications, aside from those expressly stated, are possible and within the scope of the appending claims.

What is claimed is:

1. A method of phase sensitive magnetic resonance image (MRI) reconstruction using partial k-space data comprising the steps of:
   acquiring a partial k-space data set having both imaginary and real components containing both magnitude and phase information;
   filtering the partial k-space data set through high and low-pass filters and a linear construction of both;
   Fourier transforming the filtered data set;
   estimating a blurring correction factor representative of a convolution error term from a portion of the filtered data set; and
   applying the blurring correction factor to the filtered data set to remove the convolution error term and reconstruct an MRI having both magnitude and phase information thereby minimizing edge blurring in the reconstructed MRI.

2. The method of claim 1 wherein the step of acquiring the partial k-space data set is further defined as acquiring an MRI data set of approximately 75% to 80% of a full MRI data set and further comprising the step of calculating a low frequency spatial phase and wherein the step of applying the blurring correction factor further includes applying the low frequency spatial phase with the blurring correction factor to the filtered data set to remove the convolution error term.

3. The method of claim 1 wherein the step of estimating a blurring correction factor is accomplished with a weighting factor derived from a step filter.

4. The method of claim 1 wherein the step of filtering the partial k-space data set further includes applying a first weighting factor to the partial k-space data set, the first weighting factor defined as:

$$W_H(k) = \begin{cases} 0, & k < -k_0 \\ 1, & -k_0 \leq K \leq k_0 \\ 2, & k > +k_0 \end{cases}.$$

5. The method of claim 4 wherein the step of filtering the partial k-space data set further includes applying a second weighting factor to the partial k-space data set, the second weighting factor defined as:

$$W_L(k) = \begin{cases} 1, & -k_0 \leq k \leq k_0 \\ 0, & \text{otherwise} \end{cases}.$$

6. The method of claim 4 wherein the step of filtering the partial k-space data set further includes applying a third weighting factor to the partial k-space data set, the third weighting factor defined as:

$$W_{HH}(k) = \begin{cases} 1, & k > k_0 \\ 0, & \text{otherwise} \end{cases}.$$

7. The method of claim 1 wherein the partial k-space data set is a high-fractional echo data set.

8. The method of claim 1 wherein the partial k-space data set is a partial NEX data set.

9. The method of claim 1 further comprising the step of initially Fourier transforming the acquired k-space data set before the filtering step in a direction in which data is not absent.

10. The method of claim 9 wherein the step of initially Fourier transforming the filtered data set is further defined as Fourier transforming the filtered data set in a direction in which data is absent.

11. The method of claim 1 wherein the step of estimating a blurring correction factor includes calculating a spatially varying phase and is further defined as:

$$\exp(j\phi_L(x)) = \frac{g_L(x)}{\|g_L(x)\|}$$

where $g_L(X)$ is the Fourier transform of the low-pass filtered data.

12. A system to correct edge blurring in an image reconstructed with partial k-space data comprising:
   a magnetic resonance imaging system having a plurality of gradient coils positioned about a bore of a magnet to impress a polarizing magnetic field and an RF transceiver system and an RF modulator controlled by a pulse control module to transmit RF signals to an RF coil assembly to acquire MR images; and
   a computer programmed to:
   acquire a partial k-space data set having both magnitude and phase information; filter the partial k-space data set through high and low-pass filters and a linear combination of both the high and low-pass filters;

Fourier transform the filtered data set;
estimate a blurring correction factor representative of a convolution error term from a portion of the filtered data set; and
apply the blurring correction factor to the filtered data set to remove the convolution error term and reconstruct an MRI preserving both magnitude and phase information while minimizing edge blurring in the reconstructed MRI.

13. The system of claim 12 wherein the acquisition of partial k-space data set is approximately 75% to 80% of a full MRI data set and wherein the computer is further programmed to calculate a low frequency spatial phase and the application of the blurring correction factor further includes applying the low frequency spatial phase with the blurring correction factor to the filtered data set to remove the convolution error term.

14. The system of claim 12 wherein the partial k-space data set is filtered through first and second weighting factors, the first weighting factor defined as:

$$W_H(k) = \begin{cases} 0, & k < -k_0 \\ 1, & -k_0 \leq K \leq k_0 \\ 2, & k > +k_0 \end{cases} ; \text{ and}$$

the second weighting factor defined as:

$$W_L(k) = \begin{cases} 1, & -k_0 \leq k \leq k_0 \\ 0, & \text{otherwise} \end{cases}.$$

15. The system of claim 14 wherein the computer is further programmed to apply a third weighting factor to the partial k-space data set, the third weighting factor defined as:

$$W_{HH}(k) = \begin{cases} 1, & k > +k_0 \\ 0, & \text{otherwise} \end{cases}.$$

16. The system of claim 12 wherein the computer is programmed to initially Fourier transform the acquired k-space data set before the filtering step in a direction in which data is not absent, and then Fourier transform the filtered data set in a direction in which data is absent.

17. The system of claim 12 wherein the blurring correction factor estimation includes calculating a spatially varying phase and is further defined as:

$$\exp(j\phi_L(x)) = \frac{g_L(x)}{\|g_L(x)\|}$$

where $g_L(X)$ is the Fourier transform of the low-pass filtered data.

18. A system for minimizing edge blurring in a reconstructed magnetic resonance image (MRI) using partial k-space data comprising;

means for acquiring partial k-space data containing both magnitude and phase components;
means for partially calculating a homodyne reconstructed MRI:
means for retaining the phase component in the partially calculated homodyne reconstructed MRI; and
means for removing a blurring error factor from the partially calculated homodyne reconstructed MRI wherein the partially calculated homodyne reconstructed MRI has both the phase component and a magnitude component therein with reduced MRI edge blurring.

19. The system of claim 18 wherein the means for acquiring is further defined as acquiring an MRI data set of approximately 75% to 80% of a full MRI data set, and further comprises a means for calculating a low frequency spatial phase and wherein the means for removing the blurring correction factor further includes applying the low frequency spatial phase with the blurring correction factor to the filtered data set to remove the convolution error term.

20. The system of claim 18 further comprising a means for estimating a blurring correction factor with a weighting factor derived from a step filter, and
a means for filtering the partial k-space data set through a first weighting factor defined as:

$$W_H(k) = 2 - \frac{1}{1 + \exp((k - k_0)/ntrans)} - \frac{1}{1 + \exp((k - k_0)/ntrans)},$$

where ntrans is a transition width of a fermi distribution function.

21. The system of claim 20 wherein the means for filtering the partial k-space data set further includes applying a second weighting factor to the partial k-space data set, the second weighting factor defined as:

$$W_{HH}(k) = 1 - \frac{1}{1 + \exp((k - k_0)/ntrans)}.$$

22. The system of claim 18 further comprising a means for parallel processing at least three predefined subroutines, a first subroutine defined as applying a first low-pass filter to the partial k-space data, a second subroutine defined as applying a first high-pass filter to the partial k-space data, and a third subroutine defined as applying a linear combination of the high-pass and low-pass filters.

23. The system of claim 22 wherein the means for removing the blurring error factor combines each of the at least three parallel processed predefined subroutines for reducing edge blurring in an MRI while retaining both phase and magnitude representations in a reconstructed MRI.

* * * * *

UNITED STATES PATENT AND TRADEMARK OFFICE
CERTIFICATE OF CORRECTION

PATENT NO. : 6,208,139 B1
DATED : March 27, 2001
INVENTOR(S) : Foo et al.

Page 1 of 1

It is certified that error appears in the above-identified patent and that said Letters Patent is hereby corrected as shown below:

Column 1,
Line 34, delete "$\Phi(r)$" and insert -- $\Phi(x)$ --.

Column 2,
Line 21, delete "FIRS" and insert -- MRI --.
Line 50, delete "MIR" and insert -- MRI --.

Column 3,
Line 26, delete "MIR" and insert -- NMR --.

Column 4,
Line 5, delete "NR" and insert -- NMR --.

Column 7,
Line 32, delete "Bo" and insert -- $B_o$ --.

Column 9,
Line 52, change "(X)" from uppercase to lowercase.

Signed and Sealed this

Twenty-second Day of January, 2002

Attest:

Attesting Officer

JAMES E. ROGAN
Director of the United States Patent and Trademark Office